(12) United States Patent
Chi

(10) Patent No.: US 7,914,620 B2
(45) Date of Patent: Mar. 29, 2011

(54) SUPPORTING DEVICE FOR HEATING CRUCIBLE AND DEPOSITION APPARATUS HAVING THE SAME

(75) Inventor: Chang-Soon Chi, Suwon-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 1029 days.

(21) Appl. No.: 11/335,740

(22) Filed: Jan. 20, 2006

(65) Prior Publication Data

US 2006/0162647 A1     Jul. 27, 2006

(30) Foreign Application Priority Data

Jan. 21, 2005    (KR) .................... 10-2005-0005862

(51) Int. Cl.
    *C23C 16/00*      (2006.01)
(52) U.S. Cl. ........................................ 118/726; 118/724
(58) Field of Classification Search .................. 118/726, 118/724
See application file for complete search history.

(56) References Cited

U.S. PATENT DOCUMENTS

| 1,760,413 A | * | 5/1930 | Kiernan | ........................ 419/28 |
| 3,329,524 A | * | 7/1967 | Smith, Jr. | ...................... 427/597 |

FOREIGN PATENT DOCUMENTS

| JP | 2002-097566 A | | 4/2002 |
| KR | 2002-0014703 | * | 9/2003 |
| WO | WO 03/079420 A1 | | 9/2003 |

OTHER PUBLICATIONS

English translation of KR 2002-0014703, Lee, Sep. 2003.*

* cited by examiner

*Primary Examiner* — Ram N Kacker
*Assistant Examiner* — Keath T Chen
(74) *Attorney, Agent, or Firm* — Lee & Morse, P.C.

(57) ABSTRACT

A device for supporting a heating crucible includes a supporting table having an upper surface in which a plurality of holes are formed, and a contamination prevention plate arranged at an entrance of each of the holes of the supporting table and having an opening portion corresponding to the hole and a shield portion extending along an inner wall of the hole.

17 Claims, 4 Drawing Sheets

SUPPORTING DEVICE FOR HEATING CRUCIBLE AND DEPOSITION APPARATUS HAVING THE SAME

CROSS-REFERENCE TO RELATED PATENT APPLICATIONS

This application claims the benefit of Korean Patent Application No. 10-2005-0005862, filed on Jan. 21, 2005, in the Korean Intellectual Property Office, the disclosure of which is incorporated herein in its entirety by reference.

BACKGROUND OF THE INVENTION

1. Field of the Invention

The present invention relates to a supporting device for a heating crucible and a deposition apparatus having the same, and more particularly, to a supporting device for a heating crucible of a deposition apparatus which prevents adhesion of a deposition material to the edge of a hole of the supporting device so that the maintenance, manage, and use of the heating crucible is made easy, and a deposition apparatus having the same.

2. Description of the Related Art

An electroluminescent display device which is one of self-light emitting type display devices has merits of a wide viewing angle, a superior contrast, a fast response speed. Thus, the electroluminescent display device is highlighted as one of next generation display devices. The electroluminescent display device is classified into an inorganic electroluminescent display device and an organic electroluminescent display device according to an emission layer (EML) formation material. The organic electroluminescent display device has merits of superior luminescence, drive voltage, and response speed characteristics and polychrome.

The organic electroluminescent display device included in a general organic electroluminescent device has an intermediate layer which includes at least an emission layer between electrodes facing each other. The intermediate layer can include a variety of layers, for example, a hole injection layer, a hole transport layer, an emission layer, an electron transport layer, or an electron injection layer. For the organic electroluminescent device, these intermediate layers are organic thin films formed of an organic material.

In the process of fabricating the organic electroluminescent device configured as above, the organic thin films such as the hole injection layer, the hole transport layer, the emission layer, the electron transport layer, or the electron injection layer can be formed in a deposition method using a deposition apparatus. That is, a substrate is arranged in a chamber in which the internal pressure is controlled to be $10^{-6}$ through $10^{-7}$ torr. An organic material is injected into a heating crucible arranged to face the substrate. The organic material in the heating crucible is vaporized or gasified using the heating crucible to be deposited on the substrate.

FIG. 1 is a perspective view of the heating crucible supporting device provided in a conventional deposition apparatus. FIG. 2 is a cross-sectional view taken along line II-II of FIG. 1.

Referring to FIGS. 1 and 2, to briefly describe the principle of deposition, after a material to be deposited is injected in a heating crucible 20, the heating crucible 20 is heated through a heat wire 30 installed outside the heating crucible 20 to make the material in the heating crucible 20 vaporized or gasified, thus implementing deposition. In doing so, it is a problem that, as the material to be deposited is emitted outside the heating crucible 20, a deposition material clod 14 adheres to the edge of a hole 12 formed in a supporting device 10 and in which the heating crucible 20 is arranged. Thus, a separate step of periodically removing the deposition material clod 14 during deposition is needed.

SUMMARY OF THE INVENTION

The present invention provides a supporting device for a heating crucible of a deposition apparatus which prevents adhesion of a deposition material to the edge of a hole of the supporting device so that the maintenance, manage, and use of the heating crucible is made easy, and a deposition apparatus having the same.

According to an aspect of the present invention, there is provided a device for supporting a heating crucible which includes a supporting table having an upper surface in which a plurality of holes are formed, and a contamination prevention plate arranged at an entrance of each of the holes of the supporting table and having an opening portion corresponding to the hole and a shield portion extending along an inner wall of the hole.

The device further includes a heating wire arranged in each of the holes of the supporting table.

The holes of the supporting table are circularly arranged.

The device further includes an actuator to rotate the supporting table.

According to another aspect of the present invention, there is provided a deposition apparatus which includes a supporting member supporting a substrate on which a deposition film is formed, a supporting device including a supporting table having an upper surface in which a plurality of holes are formed and a contamination prevention plate arranged at an entrance of each of the holes of the supporting table and having an opening portion corresponding to the hole and a shield portion extending along an inner wall of the hole, and a heating crucible arranged in each of the holes formed in the supporting table of the supporting device.

The deposition apparatus further includes a heating wire arranged in each of the holes of the supporting table.

The holes of the supporting table are circularly arranged.

The deposition apparatus further includes an actuator to rotate the supporting table.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
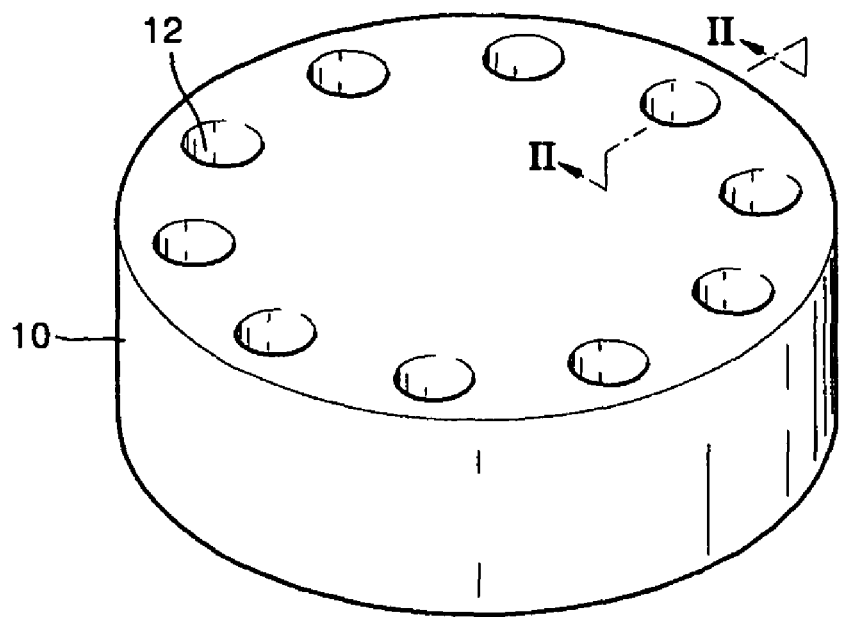
FIG. 1 is a perspective view of the conventional heating crucible supporting device.
Figure 2:
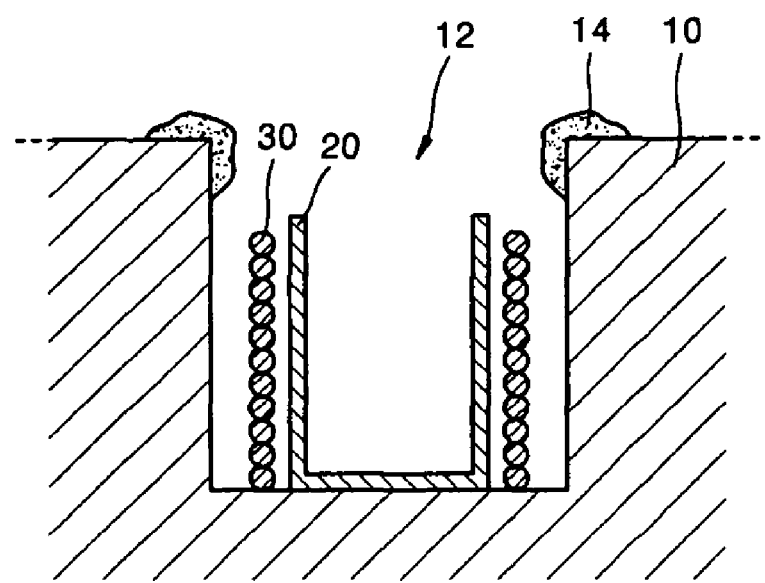
FIG. 2 is a cross-sectional view taken along line II-II of FIG. 1.
Figure 3:
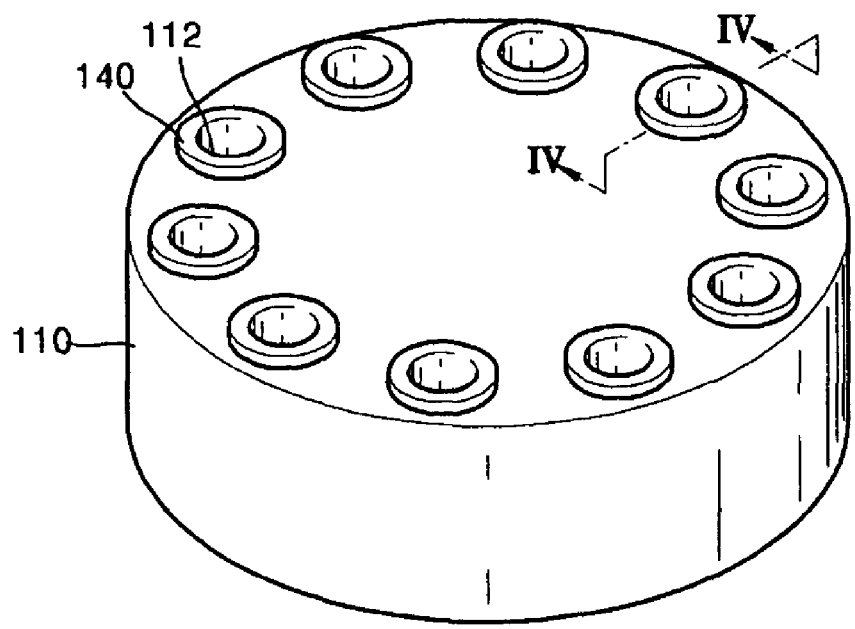
FIG. 3 is a perspective view of a heating crucible supporting device according to an embodiment of the present invention.
Figure 4:
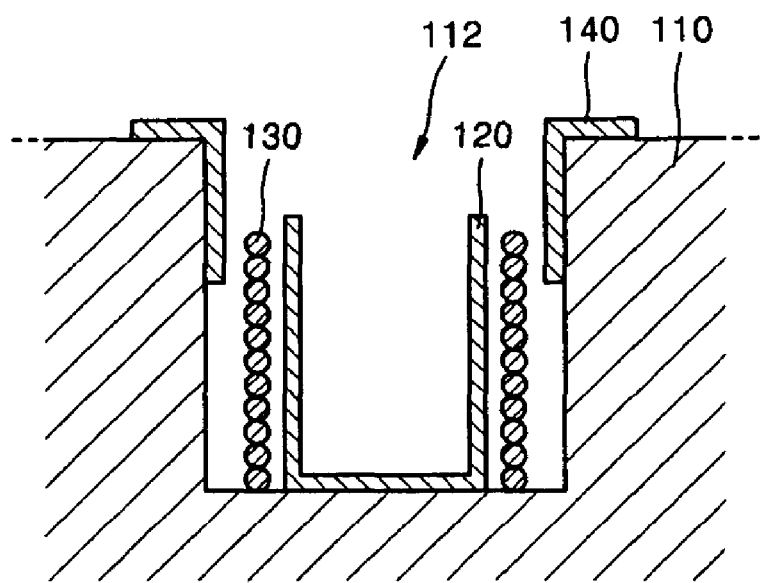
FIG. 4 is a cross-sectional view taken along line IV-IV of FIG. 3.

Referring to FIGS. 3 and 4, a plurality of holes 112 are formed in the upper surface of a supporting table 110 provided in a supporting device for a heating crucible according to an embodiment of the present invention. Although the holes 112 are arranged circularly in FIG. 3, the present invention is not limited thereto so that the holes 112 can be arranged in other pattern such as dual circles.

The supporting table 110 further includes a contamination prevention plate 140 installed at an entrance of each of the holes 112. The contamination prevention plate 140 includes an opening portion corresponding to each of the holes 112 and a shield portion extending along an inner wall 112a of each of the holes 112.

A heating crucible 120 is arranged in each of the holes 112 formed in the supporting table 110 to perform deposition. That is, the deposition is achieved as a material to be deposited is emitted from the heating crucible 120 arranged in the holes 112 through vaporization or sublimation. In this process, the emitted material may adhere to the edge of the holes 112 formed in the supporting table 110. Thus, in the heating crucible supporting device according to the present embodiment, the contamination prevention plate 140 is further provided at the entrance of each of the holes 112 of the supporting table 110 where the heating crucible 120 is placed, thus preventing adhesion of the emitted material to be deposited directly to the supporting table 110. Conventionally, the material to be deposited is emitted to adhere directly to the supporting table 110 so that an additional process to remove the adhering material is needed. However, in the heating crucible supporting device according to the present embodiment, as the material to be deposited adheres to the contamination prevention plate 140, not the supporting table 110, by replacing or separating and cleaning only the contamination prevention plate 140, the maintenance, management, and use of the heating crucible supporting device is made much easier.

A heating wire 130 can be further provided in each of the holes 112 of the supporting table 110 of the above heating crucible supporting plate. The heating wire 130 increases the temperature of the heating crucible 120 placed in each of the holes 112. For this purpose, the heating wire 130 is usually formed of a conductive material with high resistance. As current flows in the heating wire 130, heat is generated by the high resistance to heat the heating crucible 120. The shape of the heating wire 130 which is provided along the inner wall 112a of each of the holes 112 of the supporting table 110 as shown in 17 Jan. 2006 4 can be varied into a variety of shapes.

A temperature sensing unit such as a thermocouple to measure the temperature of a material to be deposited can be further provided on a bottom surface of each of the holes 112 of the supporting table 110. Also, an actuator (not shown) can be further provided to rotate the supporting table 110 of the heating crucible supporting device.

Figure 5:
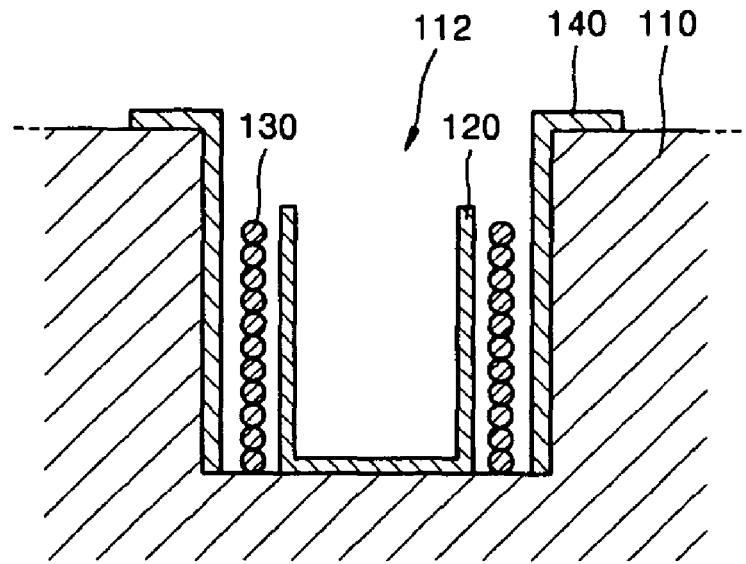
FIGS. 5 and 6 are views showing modified examples of the heating crucible supporting device of FIG. 3.
Figure 6:
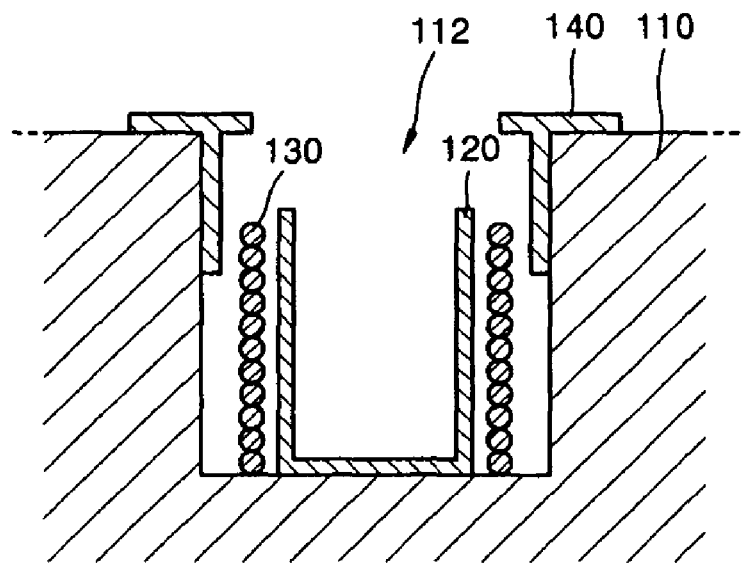

FIGS. 5 and 6 shows modified examples of the heating crucible supporting device of FIG. 3. Referring to FIGS. 5 and 6, each of the heating crucible supporting devices according to these modified examples includes the supporting table 110 and the contamination prevention plate 140 as in the heating crucible supporting device according to the previous embodiment of FIG. 4. The difference between the heating crucible supporting device according to the previous embodiment and the heating crucible supporting devices according to the modified examples lies in the shape of the contamination prevention plate 140.

The contamination prevention plate 140 is arranged at the entrance of each of the holes 112 and has the opening portion corresponding to each of the holes 112 and the shield portion extending along the inner wall 112a of each of the holes 112. In the shield portion of the contamination prevention plate 140 provided in the heating crucible supporting device according to the previous embodiment of FIG. 4 shields only the edge of each of the holes 112 of the supporting table 110 of the heating crucible supporting device. However, the shield portion can be extended to the bottom surface of the hole as shown in FIG. 5. Thus, the material to be deposited can be fundamentally prevented from adhering to the inside of each of the holes 112 of the supporting table 110 provided on the heating crucible supporting device.

Also, as shown in FIG. 6, a protruding portion protruding toward a center axis of the supporting table 110 is further provided in the contamination prevention plate 140. Thus, the radius of the opening portion formed in the contamination prevention plate 140 can be made smaller than that of each of the holes 112 formed in the supporting table 110. Furthermore, the opening portion can be made to work as a nozzle and other various modifications are possible.

Figure 7:
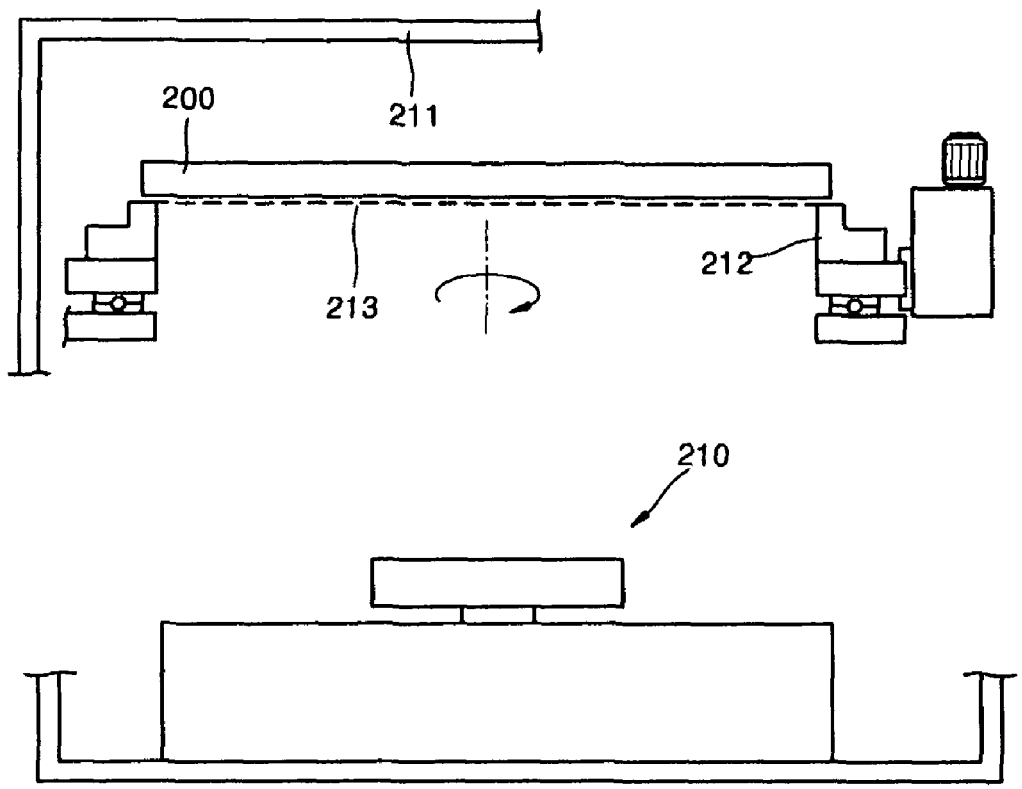
FIG. 7 is a schematic view showing a deposition apparatus according to an embodiment of the present invention.

FIG. 7 is a view showing a deposition apparatus according to an embodiment of the present invention. Referring to FIG. 7, a deposition apparatus according to the present embodiment includes a substrate supporting member 212 supporting a substrate on which a deposition film is formed and a heating crucible supporting device 210 in which a heating crucible is arranged. In detail, the deposition apparatus according to the present embodiment includes a chamber 211 including the substrate supporting member 212 supporting a substrate 200, a deposition mask 213 closely adhering to the substrate 200 and having slits corresponding to a desired deposition pattern formed therein, and the heating crucible supporting device 210 arranged to face the substrate 200 with respect to the deposition mask 213.

The substrate supporting member 212 supports the edge of the substrate 200 so that the surface of the substrate 200 to be deposited is supported corresponding to the heating crucible supporting device 210. However, the present invention is not limited thereto. Also, the substrate supporting member 212 can rotate during the deposition and other modifications are possible. The substrate supporting member 212 further includes a unit to prevent warp of the substrate 200 due to the self-weight of the substrate 200 and a unit to allow the deposition mask 213 closely contact the substrate 200.

The heating crucible supporting device 210 has a structure of the heating crucible supporting devices according to the above-described embodiment and modified examples. That is, the heating crucible supporting device 210 includes a supporting table having a plurality of holes formed in the upper surface thereof and a contamination prevention plate arranged at the entrance of each hole of the supporting table and having an opening portion corresponding to the hole and a shield portion extending along the inner wall of the hole. Also, the heating crucible supporting device 210 can further include an actuator to rotate the heating crucible supporting device 210, if necessary.

In the deposition apparatus configured as above, the material emitted from the heating crucible arranged in the holes of the supporting table provided in the heating crucible supporting device 210 is deposited on the substrate 200. The heating crucibles in which different deposition materials are injected can be provided in the holes in the supporting table of the heating crucible supporting device 210. By heating the heating crucibles selectively or in combination, various sorts of thin films can be formed. Since the uniformity and reproduction of a thin film to be deposited are very important, a unit to adjust the position of the heating crucible supporting device 210 can be further provided so that the heating crucible from which the material to be deposited is emitted is always maintained at a constant position.

In the above deposition apparatus, the maintenance, manage, and use of the deposition apparatus are made easy by using the heating crucible supporting devices according to the above-described embodiment and modified examples as the heating crucible supporting device 210. Thus, as an organic electroluminescent display device is manufactured using the deposition apparatus, manufacturing cost and required time are reduced.

As described above, according to the heating crucible supporting device according to the present invention and the deposition device having the same, the adhesion of the emitted deposition material to the edge of the hole of the supporting table of the heating crucible supporting device is prevented and only the contamination prevention plate needs to be cleaned by being replaced or separated. Accordingly, the maintenance, management, and use of the heating crucible supporting device and the deposition apparatus having the same are made easier. Also, as an organic electroluminescent display device is manufactured using the deposition apparatus, manufacturing cost and required time are reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A device for supporting a heating crucible, comprising:
   a supporting table having an upper surface in which a plurality of holes are formed;
   a heating wire arranged in each of the holes of the supporting table, the heating crucible positioned within each of the holes of the supporting table; and
   a contamination prevention plate arranged at an entrance of each of the holes of the supporting table, the contamination prevention plate including an opening portion corresponding to the hole and extending outside of the hole, and a shield portion extending along only a partial portion of an inner wall of the hole, wherein:
   a portion of the heating wire is between a lower portion of the shield portion of the contamination prevention plate and an upper portion of the heating crucible, and
   substantially an entire length of the shield portion that extends along the inner wall of the hole and surrounds the heating crucible has a constant radius, and
   the contamination prevention plate includes a protruding portion extending toward a central axis of the hole and overlapping the heating wire.

2. The device of claim 1, wherein the holes of the supporting table are circularly arranged.

3. The device of claim 1, further comprising an actuator to rotate the supporting table.

4. The device of claim 1, wherein the protruding portion extends above the hole.

5. The device of claim 4, wherein the opening portion of the contamination prevention plate extends across a partial portion of the upper surface of the supporting table that surrounds the hole, and the contamination prevention plate is separable from the upper surface of the supporting table.

6. The device of claim 1, wherein the opening portion of the contamination prevention plate extends across a partial portion of the upper surface of the supporting table that surrounds the hole, and the contamination prevention plate is separable from the upper surface of the supporting table.

7. The device of claim 6, wherein the opening portion and the shield portion are integrally formed as one continious plate, such that the opening portion of the contamination prevention plate is separable from the upper surface of the supporting table surrounding the hole, and the shielding portion is separable from the partial portion of the inner wall of the hole adjacent to the upper surface of the supporting table.

8. The device of claim 1, wherein the heating crucible and the contamination prevention plate are spaced apart, and an upper portion of the heating wire is between a lowermost portion of the shield portion of the contamination prevention plate and an uppermost portion of the heating crucible.

9. A deposition apparatus, comprising:
   a supporting member supporting a substrate on which a deposition film is formed;
   a supporting device including:
      a supporting table having an upper surface in which a plurality of holes are formed,
      a heating wire arranged in each of the holes of the supporting table, and
      a contamination prevention plate arranged at an entrance of each of the holes of the supporting table, the contamination plate including an opening portion corresponding to the hole and extending outside of the hole, and a shield portion extending along only a partial portion of an inner wall of the hole, wherein:
      a portion of the heating wire is between a lower portion of the shield portion of the contamination prevention plate and an upper portion of the heating crucible, and
      substantially an entire length of the shield portion that extends along the inner wall of the hole and surrounds a heating crucible has a constant radius, and the heating crucible arranged in each of the holes of the supporting table, and
   the contamination prevention plate includes a protruding portion extending toward a central axis of the hole and overlapping the heating wire.

10. The deposition apparatus of claim 9, wherein the holes of the supporting table are circularly arranged.

11. The deposition apparatus of claim 9, further comprising an actuator to rotate the supporting table.

12. The deposition apparatus of claim 9, wherein the protruding portion extends above the hole.

13. The deposition apparatus of claim 9, wherein the opening portion of the contamination prevention plate extends across a partial portion of the upper surface of the supporting table that surrounds the hole, and the contamination prevention plate is separable from the upper surface of the supporting table.

14. The deposition apparatus of claim 9, wherein the opening portion of the contamination prevention plate extends across a partial portion of the upper surface of the supporting table that surrounds the hole, and the contamination prevention plate is separable from the upper surface of the supporting table.

15. The deposition apparatus of claim 14, wherein the opening portion and the shield portion are integrally formed as one continious plate, such that the opening portion of the contamination prevention plate is separable from the upper surface of the supporting table surrounding the hole, and the shielding portion is separable from the partial portion of the inner wall of the hole adjacent to the upper surface of the supporting table.

16. The deposition apparatus of claim 9, wherein the heating crucible and the contamination prevention plate are spaced apart, and an upper portion of the heating wire is between a lowermost portion of the shield portion of the contamination prevention plate and an uppermost portion of the heating crucible.

17. A device for supporting a heating crucible, comprising:

a supporting table having an upper surface in which a plurality of holes are formed;

a heating wire arranged in each of the holes of the supporting table, the heating crucible positioned within each of the holes of the supporting table; and a contamination prevention plate arranged at an entrance of each of the holes of the supporting table, the contamination prevention plate including an opening portion corresponding to the hole and extending outside of the hole, and a shield portion extending along only a partial portion of an inner wall of the hole, wherein:

a portion of the heating wire is between a lower portion of the shield portion of the contamination prevention plate and an upper portion of the heating crucible, substantially an entire length of the shield portion that extends along the inner wall of the hole and surrounds the heating crucible has a constant radius, and the heating crucible and the contamination prevention plate are spaced apart, and an upper portion of the heating wire is between a lowermost portion of the shield portion of the contamination prevention plate and an uppermost portion of the heating crucible.

* * * * *